(12) United States Patent
Zhu

(10) Patent No.: US 7,696,574 B2
(45) Date of Patent: Apr. 13, 2010

(54) SEMICONDUCTOR SUBSTRATE WITH MULTIPLE CRYSTALLOGRAPHIC ORIENTATIONS

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 11/163,652

(22) Filed: Oct. 26, 2005

(65) Prior Publication Data

US 2007/0090467 A1    Apr. 26, 2007

(51) Int. Cl.
*H01L 23/62*    (2006.01)
(52) U.S. Cl. .................. 257/350; 257/353; 257/E21.32
(58) Field of Classification Search .................. 257/390, 257/353, 350, E21.32; 438/149, 154, 275
See application file for complete search history.

(56) References Cited

U.S. PATENT DOCUMENTS 6,580,154 B2    6/2003  Noble et al.
6,830,962 B1   12/2004  Guarini et al.
2004/0195646 A1  10/2004  Yeo et al.
2005/0082531 A1*  4/2005  Rim ............................ 257/72
2006/0118918 A1*  6/2006  Waite et al. .................. 257/627

FOREIGN PATENT DOCUMENTS

CN            1581497          2/2005

* cited by examiner

*Primary Examiner*—Kenneth A Parker
*Assistant Examiner*—Anthony Ho
(74) *Attorney, Agent, or Firm*—Scully, Scott, Murphy & Presser, P.C.; H. Daniel Schnurmann

(57) ABSTRACT

A semiconductor structure and its method for fabrication include a first surface semiconductor layer of a first crystallographic orientation located upon a dielectric surface of a substrate. Located laterally separated upon the dielectric surface from the first surface semiconductor layer is a stack layer. The stack layer includes a buried semiconductor layer located nearer the dielectric surface and a second surface semiconductor layer of a second crystallographic orientation different from the first crystallographic orientation located over and not contacting the buried semiconductor layer. The semiconductor structure provides a pair of semiconductor surface regions of different crystallographic orientation. A particular embodiment may be fabricated utilizing a sequential laminating, patterning, selective stripping and selective epitaxial deposition method.

7 Claims, 5 Drawing Sheets

SEMICONDUCTOR SUBSTRATE WITH MULTIPLE CRYSTALLOGRAPHIC ORIENTATIONS

FIELD OF THE INVENTION

The invention relates generally to semiconductor substrates. More particularly, the invention relates to semiconductor substrates with multiple crystallographic orientations.

DESCRIPTION OF THE RELATED ART

As semiconductor technology has advanced and semiconductor device dimensions have decreased, various effects merit additional consideration when fabricating semiconductor structures. Charge carrier effects are of particular importance since they often influence semiconductor device operating parameters such as off currents, on currents, drive currents, saturation voltages, switching voltages and the like.

Recent attention has focused on the role of semiconductor substrate crystallographic orientation upon semiconductor device performance. Different crystallographic orientations typically have different physical and electrical properties, such as charge carrier densities and piezoresistance coefficients. In light of those different physical and electrical properties, a trend has evolved that involves selection of specific semiconductor substrate crystallographic orientations in order to favor or optimize specific electrical performance within individual semiconductor devices.

As an example, Nobel et al., in U.S. Pat. No. 6,580,154, teaches a method and a resulting structure that provide semiconductor devices located lateral to a (110) silicon semiconductor substrate crystallographic orientation plane to effect enhanced conduction in a <110> direction. The enhanced conduction is realized within the context of hole charge carrier mobility. In addition, Guarini et al., in U.S. Pat. No. 6,830,962 teaches a method for fabricating a semiconductor substrate with multiple crystallographic orientations. The method utilizes a semiconductor-on-insulator substrate having top and bottom semiconductor layers of different crystallographic orientation. The method further utilizes a selective surface etch process, an epitaxial growth process and a separation by implantation of oxygen (SIMOX) process to provide the semiconductor substrate with multiple crystallographic orientations. Finally, Yeo et al., in Pub. No. 2004/0195646 teaches a method for forming a silicon-on-insulator semiconductor substrate with different crystallographic orientations. The method utilizes recrystallization of an amorphous silicon layer.

Desirable are additional methods and structures that allow multiple semiconductor structures and devices to be located upon multiple crystallographic orientations of a single semiconductor substrate.

SUMMARY OF THE INVENTION

The invention provides a semiconductor structure with enhanced utility. The invention also provides a general method for fabricating the semiconductor structure, as well as a more specific method for fabricating a specific embodiment of the semiconductor structure.

The inventive semiconductor structure comprises a substrate that, in turn, includes a dielectric surface. The semiconductor structure also comprises a first surface semiconductor layer of a first orientation located upon the dielectric surface. Finally, the semiconductor structure also comprises a stack layer located laterally separated from the first surface semiconductor layer upon the dielectric surface. The stack layer comprises: (1) a buried semiconductor layer located nearer the dielectric surface; and (2) a second surface semiconductor layer of a second orientation different from the first orientation located over and not contacting the buried semiconductor layer.

A non-limiting embodiment of the invention further provides that the buried semiconductor layer is of the first orientation. The non-limiting embodiment further comprises a buried dielectric layer located interposed between the buried semiconductor layer and the second surface semiconductor layer.

The inventive semiconductor structure provides two separate surface semiconductor layers having two separate crystallographic orientations. Such a semiconductor structure allows for the presence of different semiconductor devices and semiconductor structures upon the two separate surface semiconductor layers. The different devices and structures may be optimized in accordance with the two separate crystallographic orientations.

The invention also provides a general method for fabricating the semiconductor structure.

The general method provides for forming laterally separated upon a dielectric surface of a substrate: (1) a first surface semiconductor layer of a first orientation; and (2) a stack layer which comprises a buried semiconductor layer formed over the dielectric surface and a second surface semiconductor layer of a second orientation different from the first orientation formed over and not contacting the buried semiconductor layer.

Thus, the general method corresponds generally with the inventive semiconductor structure.

The invention also provides a more specific method that derives from a non-limiting embodiment of the invention.

The more specific method first provides a substrate comprising a dielectric surface having a first semiconductor layer of a first orientation formed thereupon. The method next provides for bonding a second semiconductor layer of a second orientation different from the first orientation to the first semiconductor layer, while utilizing a bonding layer. The method next provides for patterning the second semiconductor layer, bonding layer and first semiconductor layer to form laterally separated upon the dielectric surface a first stack layer and a second stack layer each comprising a patterned second semiconductor layer, a patterned bonding layer and a patterned first semiconductor layer. The method further provides for stripping the patterned second semiconductor layer and the patterned bonding layer from the second stack layer, but not the first stack layer, to expose the patterned first semiconductor layer of the second stack layer. Finally, the method provides for augmenting epitaxially the patterned first semiconductor layer of the second stack layer to the height of the patterned second semiconductor layer of the first stack layer.

Within the foregoing more specific method, the bonding layer typically comprises a dielectric material. The inventive semiconductor structure is not limited by the foregoing more specific method for its fabrication that derives from a particular non-limiting embodiment. Rather, alternative laminating, delaminating, thinning and epitaxial methods in varying orders are not excluded for fabricating a semiconductor structure in accord with the invention or a particular non-limiting embodiment of the invention.

BRIEF DESCRIPTION OF THE DRAWINGS

The objects features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention provides a semiconductor structure with enhanced utility, as well as methods for fabricating the semiconductor structure.

FIGS. 1 to 11 show a series of schematic cross-sectional diagrams illustrating the results of progressive stages in fabricating a semiconductor structure in accordance with preferred embodiments of the invention.

Figure 1:
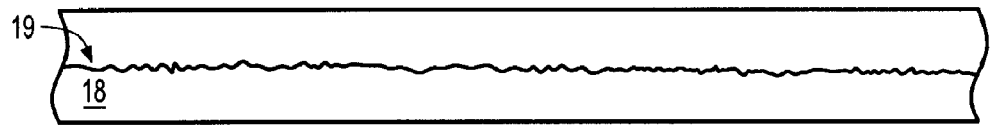
FIGS. 1-11 show a series of schematic cross-sectional diagrams illustrating the results of progressive stages of fabricating a semiconductor structure in accord with a preferred embodiment of the invention.
Figure 1:
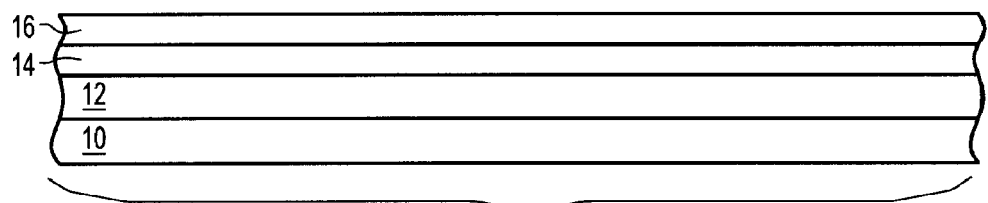

Specifically, FIG. 1 shows a substrate 10 including a buried dielectric layer 12 located upon a surface of the substrate 10. A first semiconductor layer 14 is located upon the buried dielectric layer 12. Finally, a bonding layer 16 is located upon the first semiconductor layer 14.

The substrate 10 is typically a semiconductor substrate, although the invention is not necessarily limited to the substrate 10 as a semiconductor substrate. The substrate 10 may most generally be formed of a conductor material, a semiconductor material or a dielectric material, provided that: (1) the first semiconductor layer 14 comprises a semiconductor material with a designated first crystallographic orientation; and (2) the first semiconductor layer 14 is located upon a dielectric surface, such as provided by the buried dielectric layer 12. Such a dielectric surface may alternatively be provided when the substrate 10 comprises a dielectric material. When the substrate 10 comprises a semiconductor material, it may comprise a semiconductor material such as, but not limited to: silicon, germanium, a silicon-germanium alloy, silicon carbide, silicon-germanium carbide alloy or a compound (i.e., III-V or II-VI, including but not limited to: gallium arsenide, indium arsenide and indium phosphide) semiconductor material. Included are semiconductor materials that also incorporate appropriate dopants. Most typically, the substrate 10 comprises silicon or silicon-germanium alloy semiconductor material. The substrate 10 typically has a thickness of about 1 to about 2 millimeters, but the invention is not so limited.

The buried dielectric layer 12 typically comprises an oxide dielectric material when the substrate 10 comprises a silicon semiconductor material or a silicon-germanium alloy semiconductor material. Other conventional dielectric materials may also be utilized. Non-limiting examples include nitride dielectric materials and oxynitride dielectric materials. Typically, the buried dielectric layer 12 has a thickness from about 1000 to about 15000 angstroms.

Although not specifically limited thereto, the first semiconductor layer 14 also typically comprises a silicon semiconductor material or a silicon-germanium alloy semiconductor material. The invention may also be practiced with a first semiconductor layer 14 that comprises a germanium semiconductor material, a silicon carbide semiconductor material, a silicon-germanium alloy carbide semiconductor material or a compound semiconductor material (in accord with above disclosure for the substrate 10). Typically, the first semiconductor layer 14 has a thickness from about 50 to about 100 angstroms. Within the context of the invention, the first semiconductor layer 14 has a first crystallographic orientation (alternatively referred to as a "first orientation"). The first crystallographic orientation may be selected from any of several conventional or non-conventional crystallographic orientations. For purposes of illustration within the invention, the first crystallographic orientation may be a (001), (011), (100), (110) or (111) crystallographic orientation. Alternative crystallographic orientations, while less common, are not excluded from the instant embodiment or the invention.

The invention preferably utilizes a substrate 10 comprising silicon, germanium or silicon-germanium alloy semiconductor material of a designated crystallographic orientation; (2) a buried dielectric layer 12 comprising an oxide or nitride; and (3) a first semiconductor layer 14 comprising the corresponding silicon, germanium or silicon-germanium alloy semiconductor material having the designated crystallographic orientation. Within the instant embodiment, the designated crystallographic orientation is the first crystallographic orientation.

The foregoing layered stack of the substrate 10, the buried dielectric layer 12 and the first semiconductor layer 14 is recognized as a semiconductor-on-insulator substrate. Such a semiconductor-on-insulator substrate may be fabricated utilizing methods as are conventional in the art. The methods may include, but are not limited to: (1) layer laminating and transfer methods; as well as (2) ion implantation and annealing methods such as separation by implantation of oxygen (SIMOX) methods. Alternative methods may also be utilized.

The bonding layer 16 may comprise any of several bonding materials, but will typically comprise an oxide bonding material that also serves as a dielectric material. It will typically comprise, consist essentially of or consist of an oxide of the semiconductor material which comprises the first semiconductor layer 14. Nitrides and oxynitrides, while less common, may under certain circumstances provide an operable invention. Generally, the bonding layer 16 comprises a silicon oxide, germanium oxide or silicon-germanium alloy oxide. Any of the foregoing oxide materials may be formed utilizing a thermal oxidation method. Alternative oxide, nitride or oxynitride deposition methods, may include, but not limited to: chemical vapor deposition methods, thermal oxidation, and physical vapor deposition methods, and more specifically atomic layer deposition methods. Typically, the bonding layer 16 has a thickness from about 20 to about 50 angstroms. The invention is not limited to a bonding layer 16 thickness in the foregoing range.

FIG. 1 also shows a second semiconductor substrate 18. Although it is illustrated as a bulk semiconductor substrate, neither the instant embodiment nor the invention is so limited. The instant embodiment and the invention may utilize a second semiconductor substrate as a bulk semiconductor substrate, a semiconductor-on-insulator substrate or an alternatively conventionally or unconventionally laminated semiconductor substrate.

As is illustrated in FIG. 1, the second semiconductor substrate 18 has a fracture plane 19 contained within its thickness. The fracture plane 19 provides for subsequent thinning of the second semiconductor substrate 18. The fracture plane 19 may be induced within the second semiconductor substrate 18 by a depth specific blanket implantation of a fracture inducing material. Hydrogen or hydrogen containing fracture inducing materials are common, but are not limiting within the context of the instant embodiment. In addition, neither the instant embodiment nor the invention in general is specifically limited to a second semiconductor substrate 18 having a fracture plane 19. Alternative etching and polishing methods may also be employed for an eventual thinning of the second semiconductor substrate 18. Such methods include, but are not limited to: wet chemical etch methods, dry plasma etch methods, mechanical polish methods and chemical mechanical polish methods.

Figure 2:
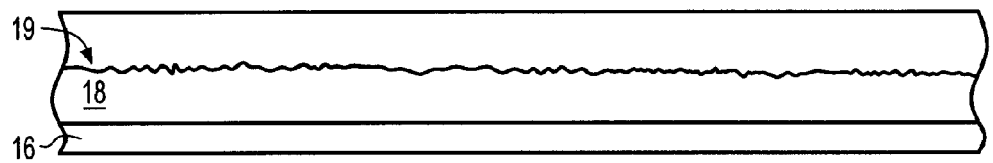
Figure 2:
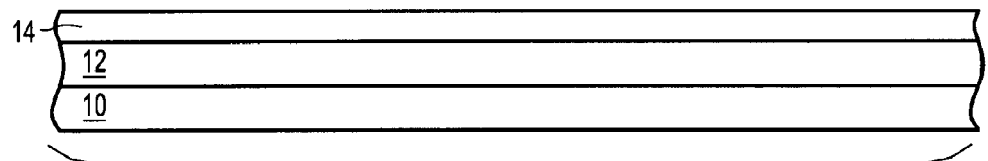

FIG. 2 correlates with FIG. 1, but with the exception that the bonding layer 16 is located upon the second semiconductor substrate 18 rather than the first semiconductor layer 14. The invention is operable with the two substrates as illustrated in FIG. 1, the two substrates as illustrated in FIG. 2 or alternatively when a bonding layer is located upon each of a pair of semiconductor layers or semiconductor substrate surfaces within a pair of starting substrates. This later embodiment is not specifically shown in the accompanying drawings. Within the context of the instant embodiments such an embodiment would provide a bonding layer upon each of the first semiconductor layer 14 and the second semiconductor substrate 18.

Figure 3:
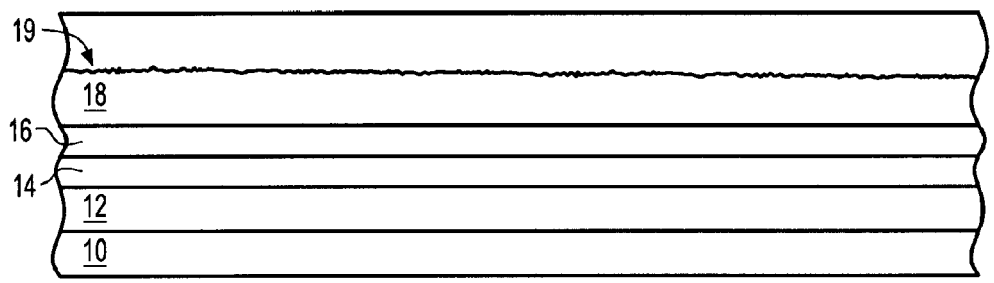

FIG. 3 shows the results of bonding the two substrates as illustrated in FIG. 1 or FIG. 2. The bonding layer 16 is utilized as an interfacial bonding layer. The bonding is typically undertaken at a temperature from about 300° to about 500° C. for an annealing time period from about 30 minutes to about 20 hours. A minimal or nominal physical bonding pressure may be applied, but is typically not required. The bonding is typically undertaken in an inert atmosphere comprising nitrogen, helium, argon, krypton and/or xenon.

Figure 4:
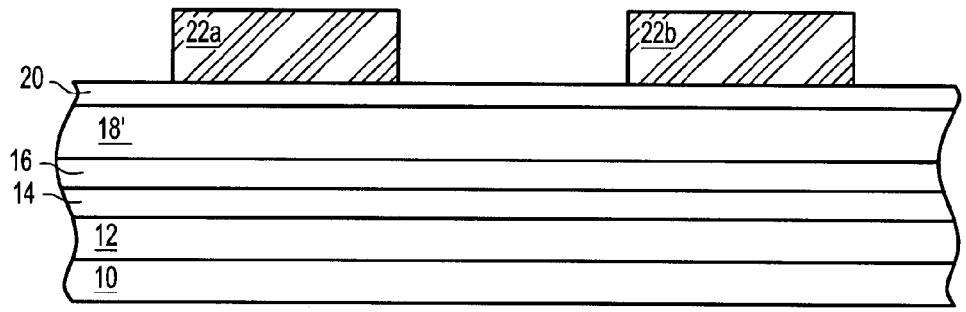

FIG. 4 first shows a second semiconductor layer 18' located upon the bonding layer 16. The second semiconductor layer 18' results from cleavage of the second semiconductor substrate 18 along the fracture plane 19. As noted above, alternative methods may also be employed for thinning the second semiconductor substrate 18 when forming therefrom the second semiconductor layer 18'. The second semiconductor layer 18' has a thickness from about 100 to about 700 angstroms although the instant embodiment is not specifically limited to a thickness in that range.

FIG. 4 also shows a hard mask layer 20 located upon the second semiconductor layer 18'. The hard mask layer 20 may comprise hard mask materials as are conventional in the semiconductor fabrication art. They will typically include, but are not limited to: silicon nitride materials and silicon oxynitride materials. Typically the hard mask layer 20 has a thickness from about 100 to about 200 angstroms. The hard mask layer 18 may be formed utilizing methods as are conventional in the art. Non-limiting examples include chemical vapor deposition methods and physical vapor deposition methods.

FIG. 4 finally shows a pair of patterned first photoresist layers 22a and 22b located laterally separated upon the hard mask layer 20. The pair of patterned first photoresist layers 22a and 22b is dimensioned to eventually provide patterned semiconductor layer mesas of size appropriate for submicron devices and structures to be subsequently formed therein. The pair of patterned first photoresist layers 22a and 22b may comprise positive photoresist materials, negative photoresist materials or hybrid photoresist materials. Typically, each of the pair of patterned first photoresist layers 22a and 22b has a thickness from about 2000 to about 10000 angstroms. The photoresist layers are formed utilizing coating, exposure and development methods and materials as are generally conventional in the semiconductor fabrication art.

Figure 5:
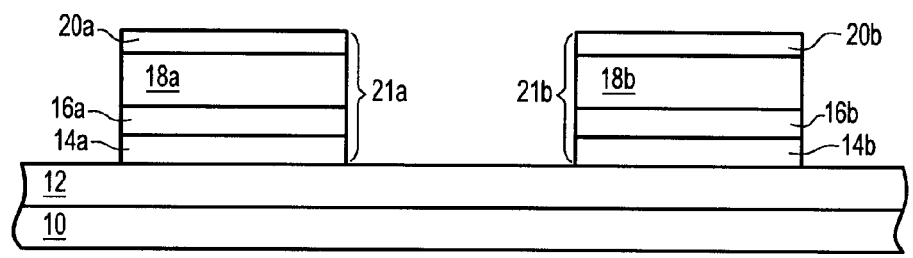

FIG. 5 shows a pair of patterned stack layers 21a and 21b located upon the buried dielectric layer 12. The patterned stack layers 21a and 21b comprise (in outward progression): (1) a pair of patterned first semiconductor layers 14a and 14b located upon and the buried dielectric layer 12; (2) a pair of patterned bonding layers 16a and 16b located aligned upon the pair of patterned first semiconductor layers 14a and 14b; (3) a pair of patterned second semiconductor layers 18a and 18b located aligned upon the pair of patterned bonding layers 16a and 16b; and (4) a pair of patterned hard mask layers 20a and 20b located aligned upon the pair of patterned second semiconductor layers 18a and 18b. Within the pair of patterned stack layers 21a and 21b, each of the pair of patterned second semiconductor layers 18a and 18b is thus located over, but not contacting, the pair of patterned first semiconductor layers 14a and 14b.

The pair of patterned stack layers 21a and 21b is patterned from the corresponding first semiconductor layer 14, bonding layer 16, second semiconductor layer 18 and hard mask layer 20. The pair of patterned first photoresist layers 22a and 22b is utilized as a mask and the buried dielectric layer 12 is utilized as an etch stop layer. An anisotropic etch method is preferred since it avoids undercutting of the patterned stack layers 21a and 21b. The anisotropic etch method may include, but is not limited to: a chemically assisted etch such as, but not limited to a reactive ion etch; or a physical etch such as but not limited to an ion beam etch.

Subsequent to the foregoing patterning, FIG. 5 also shows the results of stripping the pair of patterned first photoresist layers 22a and 22b from the pair of patterned hard mask layers 20a and 20b. The pair of patterned first photoresist layers 22a and 22b may be stripped utilizing methods and materials as are conventional in the semiconductor fabrication art. They may include, but are not limited to: wet chemical etch methods and materials, dry plasma etch methods and materials, and combinations thereof.

Figure 6:
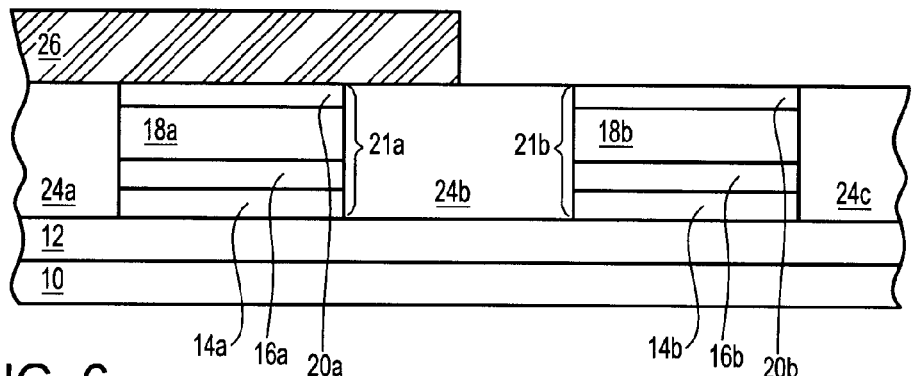

FIG. 6 first shows a series of dielectric isolation layers 24a, 24b and 24c located interposed between and laterally adjacent and adjoining the pair of patterned stack layers 21a and 21b. The series of dielectric isolation layers 24a, 24b and 24c is intended to assist in electrically isolating the semiconductor layers within the pair of patterned stack layers 21a and 21b. The series of dielectric isolation layers 24a, 24b and 24c typically comprises silicon oxide dielectric materials. The invention also contemplates that other dielectric materials may alternatively be utilized. These alternative dielectric materials may include, but are not limited to: silicon nitride, silicon oxynitride, fluorosilicate glass, silicon carbide, carbon doped silicon oxide, silicate spin-on-glass, and silsesquioxane spin-on-glass dielectric materials, as well as laminates and composites thereof.

As is illustrated in FIG. 6, the series of dielectric isolation layers 24a, 24b and 24c is coplanar with the pair of patterned hard mask layers 20a and 20b. The same is not a requirement in the invention, but rather a dielectric isolation layer may alternatively fully cover the pair of patterned stack layers 21a and 21b and provide a thickness of perhaps about 200 to about 1000 angstroms upon each of the pair of patterned hard mask layers 20a and 20b. Nonetheless, in accord with FIG. 6, the series of dielectric isolation layers 24a, 24b and 24c is typically formed utilizing a blanket layer deposition and planarization method. The planarization may be effected utilizing a chemical or physical etch back method, or alternatively a mechanical or chemical mechanical polish planarizing method.

FIG. 6 also shows a patterned second photoresist layer 26 located upon and covering the patterned hard mask layer 20a and bridging to portions of the dielectric isolation layers 24a and 24b, but leaving exposed the patterned hard mask layer 20b. The patterned second photoresist layer 26 may be formed utilizing methods, materials and thickness limitations analogous, equivalent or identical to the methods, materials and thickness limitations utilized for forming the pair of patterned first photoresist layers 22a and 22b as illustrated in FIG. 4.

Figure 7:
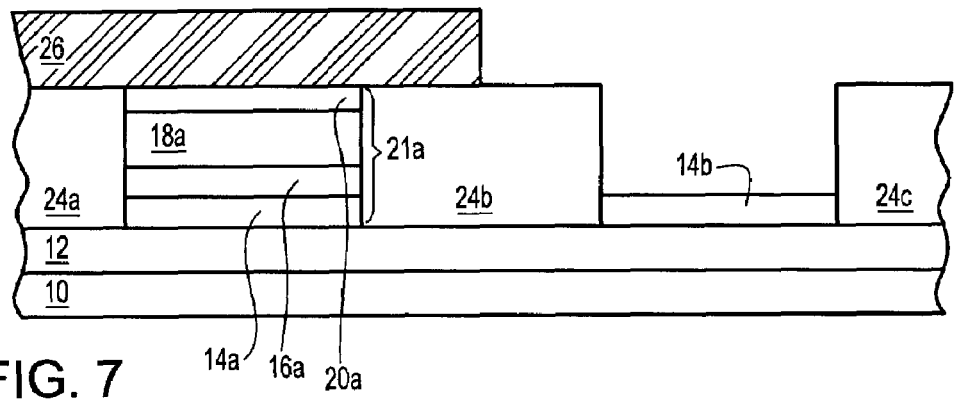

FIG. 7 shows the results of sequentially stripping the patterned hard mask layer 20b, the patterned second semiconductor layer 18b and the patterned bonding layer 16b from the patterned first semiconductor layer 14b within the patterned stack layer 21b, while leaving the patterned stack layer 21a intact beneath the patterned second photoresist layer 26.

The foregoing patterned layers may be stripped utilizing wet chemical etchant methods and materials, dry plasma etchant methods and materials or aggregate methods and materials thereof. Specific etchant methods and materials are selected with an appropriate specificity for a particular patterned layer material to be etched with respect to materials surrounding the patterned layer material to be etched.

Figure 8:
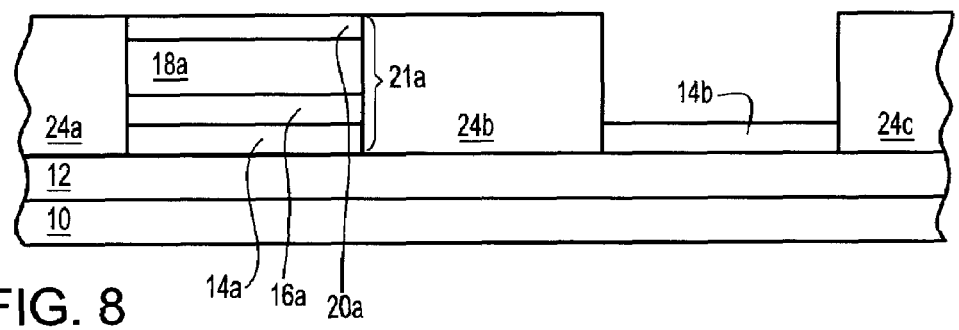

FIG. 8 shows the results of stripping the patterned second photoresist layer 26 from the semiconductor structure of FIG. 7. The patterned second photoresist layer 26 may be stripped utilizing methods and materials analogous, equivalent or identical to those employed for stripping the pair of patterned first photoresist layers 22a and 22b to provide in part the semiconductor structure as illustrated in FIG. 5.

Figure 9:
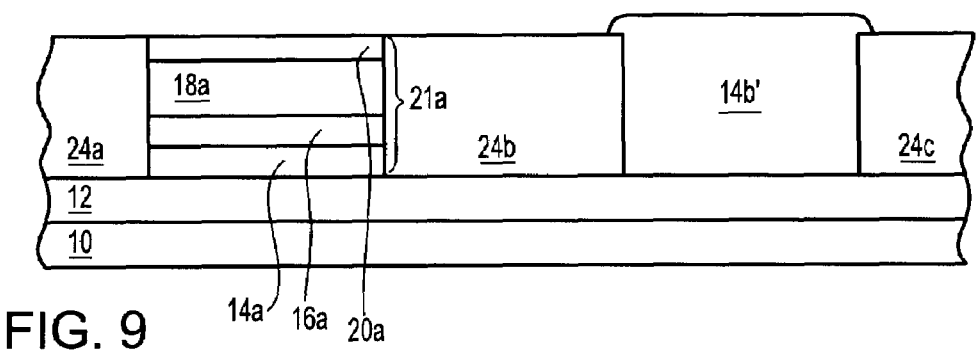

FIG. 9 shows an epitaxially augmented patterned first semiconductor layer 14b' located laterally separated from the patterned first stack layer 21a upon the buried dielectric layer 12. The epitaxially augmented patterned first semiconductor layer 14b' results from epitaxial growth of the patterned first semiconductor layer 14b. The epitaxial growth may be effected employing epitaxial methods and materials as are conventional in the art and appropriate within the context of the material(s) from which is formed the patterned first semiconductor layer 14b. The epitaxially augmented patterned first semiconductor layer 14b' is typically grown to a height that exceeds the height of the series of dielectric isolation layers 24a, 24b and 24c. This coincidentally provides a height greater than the patterned stack layer 21a.

Figure 10:
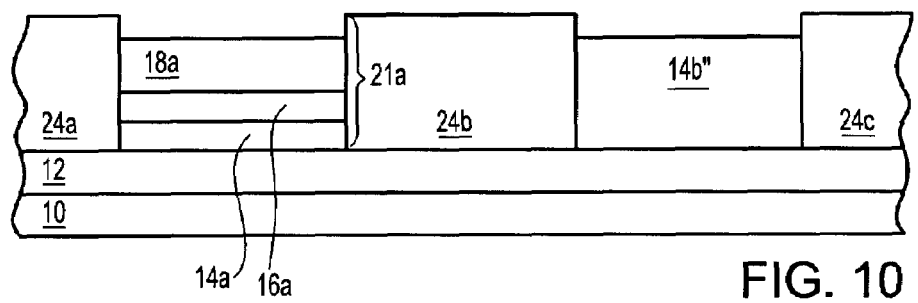

FIG. 10 first shows a planarized and etched back epitaxially augmented patterned first semiconductor layer 14b''. It results from sequentially planarizing and etching back the epitaxially augmented patterned first semiconductor layer 14b' as illustrated in FIG. 9. Although not required within the invention, the planarizing may be effected utilizing a chemical mechanical polish planarizing method or a purely mechanical polishing of the epitaxially augmented patterned first semiconductor layer 14b'. Subsequent to such planarizing, the epitaxially augmented patterned first semiconductor layer 14b' is etched back by a distance equal to the thickness of the patterned hard mask layer 20a. The etch back may be effected utilizing wet chemical methods, dry plasma methods or aggregate methods thereof.

FIG. 10 also shows the results of stripping the hard mask layer 20a from the patterned stack layer 21a to leave exposed the patterned second semiconductor layer 18a. The hard mask layer 20a may be stripped employing any of several methods and materials appropriate to its composition. Non-limiting examples include wet chemical methods and materials, and dry plasma methods and materials. When the patterned hard mask layer 20a is comprised of a silicon nitride material, a phosphoric acid wet chemical etchant is often desirable, but the instant embodiment is not so limited. Alternatively, a reactive ion etch method may also be employed.

As is understood by a person skilled in the art, and as a result foregoing semiconductor processing when fabricating the semiconductor structure whose schematic cross-sectional diagram is illustrated in FIG. 10 from the semiconductor structure whose schematic cross-sectional diagram is illustrated in FIG. 9, an upper surface of the patterned second semiconductor layer 20a and an upper surface of the planarized and etched back epitaxially augmented patterned first semiconductor layer 14b'' at least implicitly, if not inherently, are at least substantially coplanar (i.e., within the context of manufacturing process limitations and processing variability when fabricating the semiconductor structure whose schematic cross-sectional diagram is illustrated in FIG. 10 from the semiconductor structure whose schematic cross-sectional diagram is illustrated in FIG. 9). As is further illustrated within the schematic cross-sectional diagram of FIG. 10, each of the component layers within the patterned stack layer 21a is located over the buried dielectric layer 12, which within the context of earlier processing sequencing of the instant embodiment is typically implicitly or inherently, if not explicitly, a planar dielectric layer.

FIG. 10 shows a semiconductor structure that comprises a semiconductor substrate in accordance with an embodiment of the invention. The semiconductor substrate has two separate active regions (i.e., surface semiconductor regions that derive from surface semiconductor layers). A first active region comprises a patterned first surface semiconductor layer having a first crystallographic orientation (i.e., corresponding with the planarized and etched back epitaxially augmented patterned first semiconductor layer 14b''). The second active region comprises a patterned second semiconductor layer having a second crystallographic orientation different from the first crystallographic orientation (i.e., corresponding with the patterned second semiconductor layer 18a). The semiconductor substrate provides value since it allows for different semiconductor devices to be located within the two active regions of different crystallographic orientation. In turn, the different crystallographic orientations allow for individual optimization of performance of the different semiconductor devices. Although not specifically illustrated within FIG. 10, within the instant embodiment and the invention either of the foregoing semiconductor layers or surrounding layers may be unstressed, or alternatively they may have an intrinsic or imparted stress to provide for enhanced performance.

Figure 11:
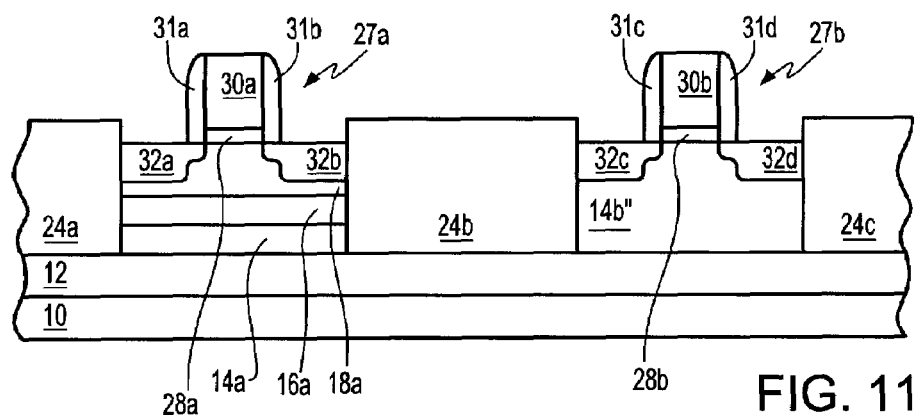

FIG. 11 shows a pair of field effect transistors 27a and 27b, one each located within the patterned second semiconductor layer 18a (preferably having a (110) or (111) crystallographic orientation and doped for a p-FET 27*a*) and the planarized and etched back epitaxially augmented patterned first semiconductor layer 14*b*" (preferably having a (100) crystallographic orientation and doped for an n-FET 27*b*). The pair of field effect transistors comprises a pair of gate dielectric layers 28*a* and 28*b* located upon the corresponding patterned second semiconductor layer 18*a* or planarized and etched back epitaxially augmented patterned first semiconductor layer 14*b*". A pair of gate electrodes 30*a* and 30*b* is located aligned upon the pair of gate dielectric layers 28*a* and 28*b*, although the embodiment and the invention also contemplate field effect transistor structures absent such alignment. A series of spacers 31*a*, 31*b*, 31*c* and 31*d* adjoins the pair of gate electrodes 30*a* and 30*b*, and the corresponding pair of aligned gate dielectric layers 28*a* and 28*b*. Finally, a series of source/drain regions (including lightly doped extension regions) 32*a*, 32*b*, 32*c* and 32*d* is located appropriately within the patterned second semiconductor layer 18*a* or the planarized and etched back epitaxially augmented patterned first semiconductor layer 14*b*", to complete the pair of field effect transistors 27*a* and 27*b*.

Each of the components that comprises the pair of field effect transistors 27*a* and 27*b* may be formed utilizing methods and materials as are otherwise generally conventional in the semiconductor fabrication art.

The pair of gate dielectric layers 28*a* and 28*b* may comprise comparatively lower dielectric constant dielectric materials (i.e., having a dielectric constant from about 4 to about 20, measured in vacuum). Such dielectric materials may include, but are not limited to: silicon oxide, silicon nitride, silicon oxynitride and mixtures thereof. The pair of gate dielectric layers 28*a* and 28*b* may alternatively comprise generally higher dielectric constant dielectric materials (i.e., having a dielectric constant from about 20 to about 100). These higher dielectric constant dielectric materials may include, but are not limited to: hafnium oxide materials, hafnium silicate materials, zirconium oxide, aluminum oxide, titanium dioxide, lantahanum oxide, strontium titanate, barium strontium titanate (BST) materials, lanthanum aluminum oxide, lead zirconate titanate (PZT) materials and other ferroelectric materials. Typically, each of the pair of gate dielectric layers 28*a* and 28*b*, when comprising a conventional thermal silicon oxide material, has a thickness from about 10 to about 70 angstroms.

The pair of gate electrodes 30*a* and 30*b* typically comprises a highly doped polysilicon material (i.e., a dopant concentration of about 1e19 to 1e22 dopant atoms per cubic centimeter). The highly doped polysilicon material may be deposited utilizing chemical vapor deposition methods or physical vapor deposition methods. Alternative gate electrode conductor materials may also be employed. Such alternative gate electrode conductor materials may include, but are not limited to: appropriate metals, metal alloys, metal silicides and metal nitrides, as well as laminates and composites thereof. The alternative gate electrode conductor materials may be deposited utilizing chemical vapor deposition, physical vapor deposition, ion implantation and thermal annealing methods. Typically, each of the gate electrodes 30*a* and 30*b* has a thickness from about 500 to about 2000 angstroms.

The series of spacer layers 31*a*, 31*b*, 31*c* and 31*d* typically comprises a silicon oxide material, silicon nitride material, silicon oxynitride material, laminate thereof or composite thereof. The series of spacers 31*a*, 31*b*, 31*c* and 31*d* is typically formed utilizing a blanket layer deposition and anisotropic etchback method. Alternative methods, materials and spacer layer shapes are not excluded from the embodiment or the invention.

The series of source/drain regions and extension regions 32*a*, 32*b*, 32*c* and 32*d* typically results from a two step ion implantation (i.e., gate electrode 30*a* or 30*b* with (heavier dose implant) and without (lighter dose implant) spacers 31*a* and 31*b* or 31*c* and 31*d*) of a dopant species of appropriate polarity and concentration. The pair of source/drain regions and extension regions 32*a* and 32*b* is typically implanted with a dopant of a p polarity suitable for a p-FET 27*a*. The pair of source/drain and extension regions 32*c* and 32*d* is typically implanted with a dopant of an n polarity suitable for an n-FET 27*b*. Both pair of source/drain regions and extension regions are implanted to provide an implanted concentration of about 1e19 to about 1e22 dopant atoms per cubic centimeter. In addition, conventional halo implantation into channel regions (n-FET with p polarity dopants and p-FET with n polarity dopants) is typically utilized to adjust threshold voltage for both n-FET 27*b* and p-FET 27*a*. The foregoing parameters do not, however, limit the invention.

Although not specifically illustrated within FIG. 11, one or both of the pair of field effect transistors 27*a* and 27*b* within the disclosed embodiment may also include capping layers, silicide layers or other field effect transistor structures as are generally conventional in the art. These additional structures may also be fabricated utilizing methods and materials as are generally conventional in the art.

As noted above, the instant embodiment provides that the patterned second semiconductor layer 18*a* preferably comprises a (110) or (111) silicon or silicon-germanium alloy semiconductor material. The field effect transistor 27*a* is preferably a p-FET. In addition, the planarized and etched back epitaxially augmented patterned first semiconductor layer 14*b*" preferably comprises a (100) silicon or silicon-germanium alloy semiconductor material. The field effect transistor 27*b* is preferably an n-FET. Such an embodiment thus provides a complementary metal oxide semiconductor device with each of a p-FET and an n-FET located upon a separate and crystallographic orientation distinct active region that allows for separate optimization of p-FET and n-FET performance.

Although the instant embodiment illustrates the invention within the context of a pair of p-FET and n-FET CMOS transistors located within crystallographic orientation distinct regions within a single semiconductor substrate, neither the embodiment nor the invention is intended to be so limited. Rather, the embodiment and the invention contemplate that alternative active and passive semiconductor devices may also be located within separate crystallographic orientation distinct active regions within a single semiconductor substrate. These devices may include, but are not limited to: bipolar transistors, bi-CMOS transistors, resistors and diodes.

In order to ascertain viability of the inventive semiconductor substrate structure with respect to semiconductor device performance, three separate computer simulations were undertaken for field effect transistor performance for a p-FET located upon three different types of (110) silicon semiconductor substrates. The three different types of (110) silicon semiconductor substrates were: (1) a conventional semiconductor-on-insulator (110) silicon semiconductor substrate, where a thickness of a semiconductor surface layer was 550 angstroms and a thickness of a buried dielectric layer was 1500 angstroms; (2) a semiconductor substrate in accordance with FIG. 10 where the patterned second semiconductor layer 18*a* of (110) crystallographic orientation had a thickness of 550 angstroms, the patterned bonding layer 16*a* had a thickness of 10 angstroms and the patterned first semiconductor layer 14*a* of (100) crystallographic orientation had a thickness of 100 angstroms and p-type doping level of $10^{16}$ atoms/$cm^3$; and (3) a semiconductor substrate in accordance with FIG. 10 where the patterned second semiconductor layer 18a of (110) crystallographic orientation had a thickness of 550 angstroms, the patterned bonding layer 16a had a thickness of 50 angstroms and the patterned first semiconductor layer 14a of (100) crystallographic orientation had a thickness of 100 angstroms and p-type doping level of $10^{16}$ atoms/$cm^3$.

Simulation graphs were obtained for: (1) Off Current versus On Current (at saturation mode) (Vs=0.0 V, Vd=1.0 V, and Vgs=-1.0 V; (2) Threshold Voltage (at saturation mode) versus Gate Length; and (3) Drain Induced Barrier Lowering (DIBL) versus Gate Length. Results of the computer simulations are shown in the graphs of FIGS. 12-14.

Figure 12:
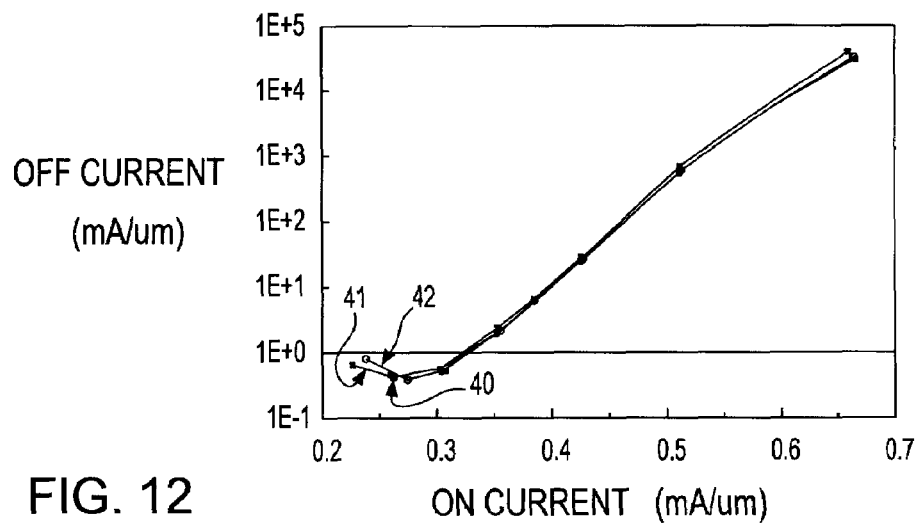
FIG. 12 shows a computer simulation graph of Off Current versus On Current for a series of field effect transistors located upon a series of semiconductor substrates not in accordance with the invention (for conventional semiconductor-on-insulator devices), and in accordance with the invention.

FIG. 12 illustrates Off Current versus On Current. Reference numeral 40 corresponds with performance of the p-FET located upon the conventional semiconductor-on-insulator semiconductor substrate. Reference numeral 41 corresponds with performance of the p-FET located upon the semiconductor substrate having the 10 angstrom thick patterned bonding layer. Reference numeral 42 corresponds with performance of the p-FET located upon the semiconductor substrate having the 50 angstrom thick patterned bonding layer.

Figure 13:
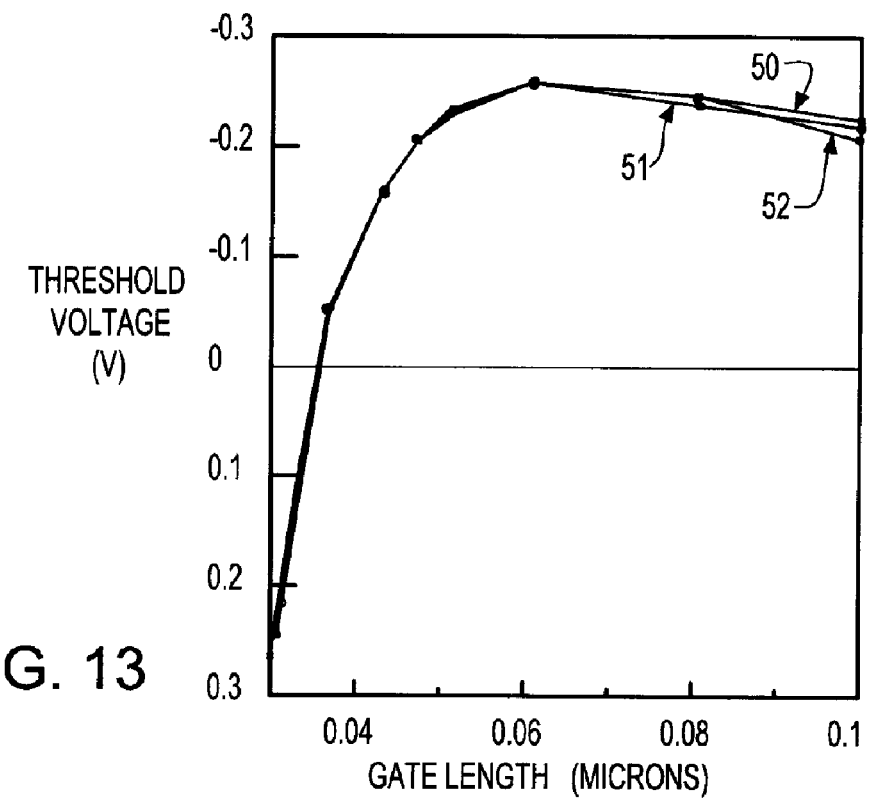
FIG. 13 shows a computer simulation graph of Threshold Voltage (in saturation mode) versus Gate Length for a series of field effect transistors located upon a series of semiconductor substrates not in accordance with the invention (for conventional semiconductor-on-insulator devices), and in accordance with the invention.

FIG. 13 illustrates Threshold Voltage versus Gate Length. Reference numeral 50 corresponds with performance of the p-FET located upon the conventional semiconductor-on-insulator semiconductor substrate. Reference numeral 51 corresponds with performance of the p-FET located upon the semiconductor substrate having the 10 angstrom thick patterned bonding layer. Reference numeral 52 corresponds with performance of the p-FET located upon the semiconductor substrate having the 50 angstrom thick patterned bonding layer.

Figure 14:
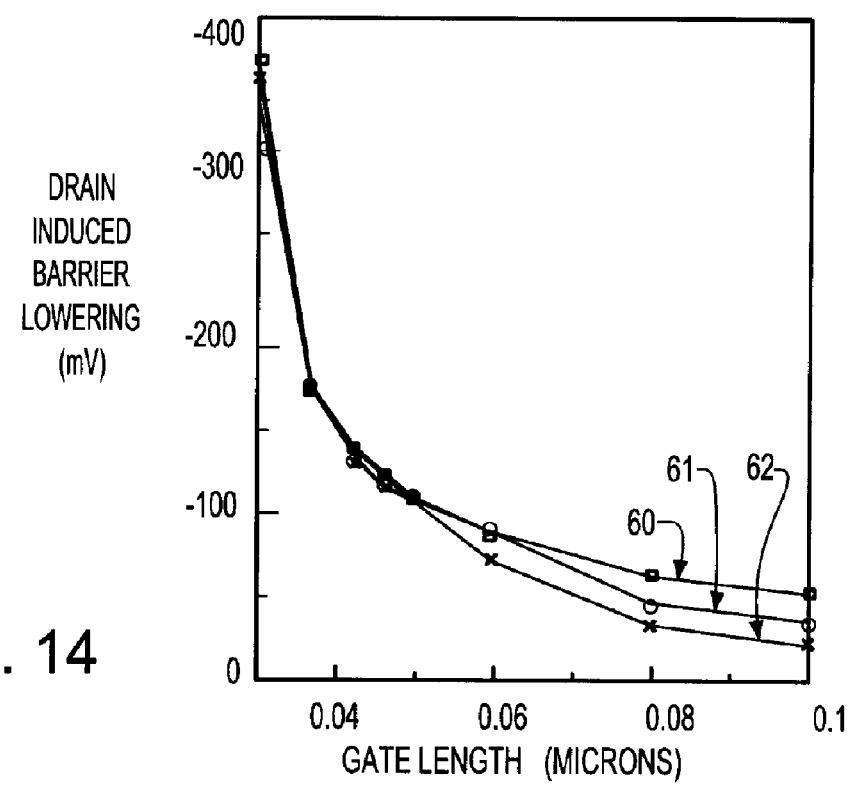
FIG. 14 shows a computer simulation graph of Drain Induced Barrier Lowering versus Gate Length for a series of field effect transistors located upon a series of semiconductor substrates not in accordance with the invention (for conventional semiconductor-on-insulator devices), and in accordance with the invention.

FIG. 14 illustrates Drain Induced Barrier Lowering versus Gate Length. Reference numeral 60 corresponds with performance of the p-FET located upon the conventional semiconductor-on-insulator semiconductor substrate. Reference numeral 61 corresponds with performance of the p-FET located upon the semiconductor substrate having the 10 angstrom thick patterned bonding layer. Reference numeral 62 corresponds with performance of the p-FET located upon the semiconductor substrate having the 50 angstrom thick patterned bonding layer.

As is seen from review of the data of each of FIGS. 12-14, there is no apparent appreciable semiconductor substrate related performance deviation for the simulations of any of the p-FET performance parameters. This indicates that the additional lightly doped buried first semiconductor layer 14a in the foregoing embodiment does not appreciably affect operating characteristics of a p-FET located upon the patterned second semiconductor layer 18a, even under circumstances where the patterned bonding layer 16a is comparatively thin. The foregoing observations are pertinent with respect to epitaxial growth and augmentation of the patterned first semiconductor layer 14b since a comparatively thin patterned first semiconductor layer 14b is desirable as a starting layer to form the epitaxially augmented patterned first semiconductor layer 14b' with limited dislocations. A comparatively thin patterned bonding layer 16a may also contribute to yield improvement.

The preferred embodiment and simulations of the invention are illustrative of the invention rather than limiting of the invention. Revisions and modifications may be made to methods, materials, structures and dimensions in accord with the preferred embodiment of simulations of the invention while still providing an embodiment in accord with the invention, further in accord with the accompanying claims.

What is claimed is:

1. A semiconductor structure comprising:
a substrate comprising a dielectric surface;
a first surface semiconductor layer of a first orientation located upon the dielectric surface;
a stack layer located laterally separated from the first surface semiconductor layer upon the dielectric surface, the stack layer comprising:
a buried semiconductor layer located near to the dielectric surface; and
a second surface semiconductor layer of a second orientation different from the first orientation located over and not contacting the buried semiconductor layer, where an upper surface of the first surface semiconductor layer and an upper surface of the second surface semiconductor are at least substantially coplanar; and
a buried dielectric layer located interposed between, horizontally coextensive with and electrically isolating the buried semiconductor layer and the second surface semiconductor layer.

2. The semiconductor structure of claim 1 wherein the buried semiconductor layer is of the first orientation.

3. The structure of claim 1 wherein the substrate further comprises a semiconductor substrate.

4. The structure of claim 1 wherein the substrate comprises a dielectric substrate having the dielectric surface.

5. The structure of claim 1 wherein the dielectric surface is planar.

6. The structure of claim 1 wherein:
the first orientation is a (100) orientation; and
the second orientation is selected from the group consisting of a (110) and a (111) orientation.

7. The structure of claim 6 further comprising:
an n-FET located upon the first surface semiconductor layer; and
a p-FET located upon the second surface semiconductor layer.

* * * * *